United States Patent
Bechtel et al.

(10) Patent No.: US 12,155,015 B2
(45) Date of Patent: Nov. 26, 2024

(54) THIN COMPACT WAVELENGTH CONVERTING STRUCTURE FOR PCLED

(71) Applicant: LUMILEDS LLC, San Jose, CA (US)

(72) Inventors: Hans-Helmut Bechtel, Aachen (DE); Parijat Deb, San Jose, CA (US); Niels Jeroen van der Veen, Geldrop (NL)

(73) Assignee: Lumileds LLC, San Jose, CA (US)

(*) Notice: Subject to any disclaimer, the term of this patent is extended or adjusted under 35 U.S.C. 154(b) by 272 days.

(21) Appl. No.: 17/218,847

(22) Filed: Mar. 31, 2021

(65) Prior Publication Data

US 2022/0320380 A1    Oct. 6, 2022

(51) Int. Cl.
*H01L 33/50* (2010.01)

(52) U.S. Cl.
CPC .... *H01L 33/502* (2013.01); *H01L 2933/0041* (2013.01)

(58) Field of Classification Search
CPC .......... H01L 33/502; H01L 2933/0041; H01L 33/501; H01L 33/505
See application file for complete search history.

(56) References Cited

U.S. PATENT DOCUMENTS

| | | |
|---|---|---|
| 8,247,248 B2 | 8/2012 | Ling |
| 9,835,310 B2 | 12/2017 | Tamaki et al. |
| 11,201,258 B2 | 12/2021 | Ikeda et al. |
| 11,347,139 B2 | 5/2022 | Yamaguchi et al. |
| 2008/0088237 A1 | 4/2008 | Kwon et al. |
| 2012/0018761 A1* | 1/2012 | Honda ............... C09K 11/7774 257/E33.061 |
| 2015/0041841 A1 | 2/2015 | Basin et al. |
| 2016/0013368 A1* | 1/2016 | Goto ............... H01L 33/507 438/27 |
| 2019/0198723 A1* | 6/2019 | Basin ............... C09K 11/02 |
| 2019/0341573 A1* | 11/2019 | Kim ............... H01L 33/644 |
| 2020/0312824 A1 | 10/2020 | Steckel et al. |

FOREIGN PATENT DOCUMENTS

| | | |
|---|---|---|
| JP | 2011168627 A | 9/2011 |
| JP | 2015090887 A | 5/2015 |
| JP | 2020088381 A | 6/2020 |
| WO | 2013/175773 A1 | 11/2013 |
| WO | 2017/138180 A1 | 8/2017 |
| WO | 2017/209152 A1 | 12/2017 |

OTHER PUBLICATIONS

From KIPO as the ISA, Notification of Transmittal of the International Search Report and the Written Opinion of the International Searching Authority, or the Declaration, PCT/US2022/019322, Jun. 21, 2022, 9 pages.

\* cited by examiner

Primary Examiner — Jonathan Han

(57) ABSTRACT

This specification discloses pcLEDs in which the wavelength converting structure comprises one or more layers of phosphor particles disposed on a transparent substrate at high packing density. The particles are coated with an inorganic non-absorbing layer which mechanically stabilizes the phosphor particle layers and provides a thermally conductive connection between the phosphor particles. The wavelength converting structure is attached to a semiconductor LED die with the transparent substrate of the wavelength converting structure facing away from the die by a thin glue layer that bonds a light emitting surface of the die to the phosphor particle layers. Methods for fabricating such pcLEDs are also disclosed.

14 Claims, 4 Drawing Sheets

THIN COMPACT WAVELENGTH CONVERTING STRUCTURE FOR PCLED

FIELD OF THE INVENTION

The invention relates generally to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

In pcLEDs, the phosphor layer converts a fraction of the light emitted by the semiconductor diode into longer wavelength emission and must also dissipate the heat which is generated in the photon down conversion process. In the luminescence process inorganic phosphor materials emit, at most, one longer wavelength photon per absorbed shorter wavelength photon. The resulting loss in photon energy is emitted as phonons, heating up the phosphor layer. For white pcLEDs the fraction of power converted into heat is as high as 205 to 30% of the optical power emitted by the blue or UV die.

Most pcLEDs are made with phosphor powder materials dissolved in a silicone matrix, with a low volume concentration of the phosphor powder material in the layer. Because the thermal conductivity of the silicone is low, the temperature in the phosphor layer in a pcLED can become very high. In high power pcLEDs (HPLEDs) the optical power per square millimeter ($mm^2$) is limited by heat dissipation and reliability issues of phosphor particles dispersed in a silicone matrix. For operating conditions of >2 Amps/$mm^2$ (more than 6 W/$mm^2$) light output and reliability of the pcLEDs is limited by the resulting temperature of the phosphor layer. The quantum efficiency QE of phosphor materials decreases with increasing temperatures and the silicones discolor at high temperatures.

SUMMARY

This specification discloses pcLEDs in which the wavelength converting structure comprises one or more layers of phosphor particles disposed on a transparent substrate at high packing density. The transparent substrate may be a glass substrate, for example. The particles are coated with an inorganic non-absorbing layer (e.g. $Al_2O_3$), which mechanically stabilizes the phosphor particle layers and provides a thermally conductive connection between the phosphor particles. The wavelength converting structure is attached to a semiconductor LED die with the transparent substrate of the wavelength converting structure facing away from the die by a thin (e.g., silicone) glue layer that bonds a light emitting surface of the die to the phosphor particle layers. The phrase "non-absorbing" means that the inorganic coating does not absorb light emitted by the LED die or by the phosphor particles.

The silicone layer wets the die, forms a very thin optical and mechanical coupling to the die, and forms an optical bond to the phosphor particles. By doing so, efficient optical coupling of the phosphor layer to the die surface can be achieved in combination with the superior heat conduction and thermal stability of the phosphor layer in its inorganic matrix. The silicone may penetrate pores in the inorganic-coated phosphor particle layers.

The packing density of the phosphor particles is the volume fraction of the total phosphor layer filled with phosphor particles. The high packing density of the phosphor layers disclosed herein results in thin phosphor layers for the size of the phosphor particle and good thermal properties. A packing density greater than or equal to 50% is desirable, greater than or equal to 55% more preferred, and greater than or equal to 60% most preferred.

The upper limit of the packing density of the phosphor particle layers is given by the maximum volume which can be filled with particles in close contact. For spherical particles with only one diameter (mono sized) the maximum packing density is about 74% for hexagonal and cubic closed packed arrangements. For a simple cubic packing of spheres the maximum packing density is about 52%. With available phosphor particle size distributions packing densities in this range can be obtained in the pcLEDs disclosed herein.

The pcLEDs disclosed herein may operate reliably at power levels well above 2 Watts/$mm^2$. Their use of phosphor particles for wavelength conversion enables the generation of a wide range of spectral distributions for the pcLED at low cost.

This specification also discloses methods for making pcLEDs as described above. In these methods, one or more layers of phosphor particles are deposited on a transparent substrate at high packing density. The particles may be deposited without a binder material. Alternatively, the phosphor particles may be deposited with a binder material that is removed after the particles are deposited. After deposition of the phosphor particles and removal of any binder with which they were deposited, an inorganic coating as described above is deposited on the phosphor particles and the phosphor particle layers.

Subsequently, the transparent substrate with one or more inorganically coated phosphor layers is diced into individual wavelength converting structures. A resulting wavelength converting structure may then be attached to an LED die light emitting surface with a transparent (e.g., silicone) glue binding the surface of the die to phosphor particle layers and with the transparent substrate on the opposite side of the phosphor particle layers from the LED die. The glue may penetrate pores in the phosphor particle layers.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
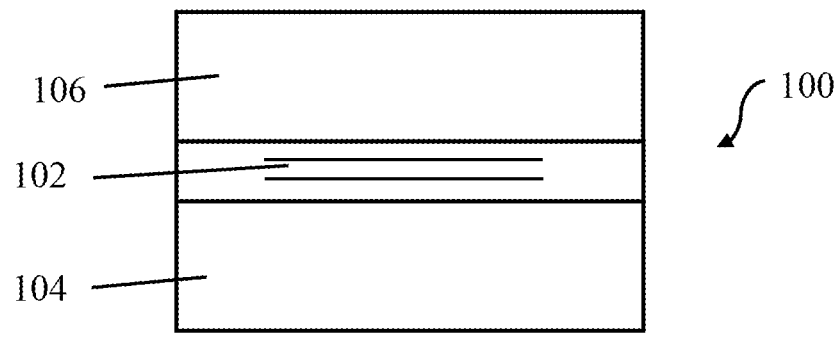
FIG. 1 shows a schematic cross-sectional view of an example pcLED.

FIG. 1 shows an example of an individual pcLED 100 comprising a light emitting semiconductor diode structure 102 disposed on a substrate 104, and a phosphor layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
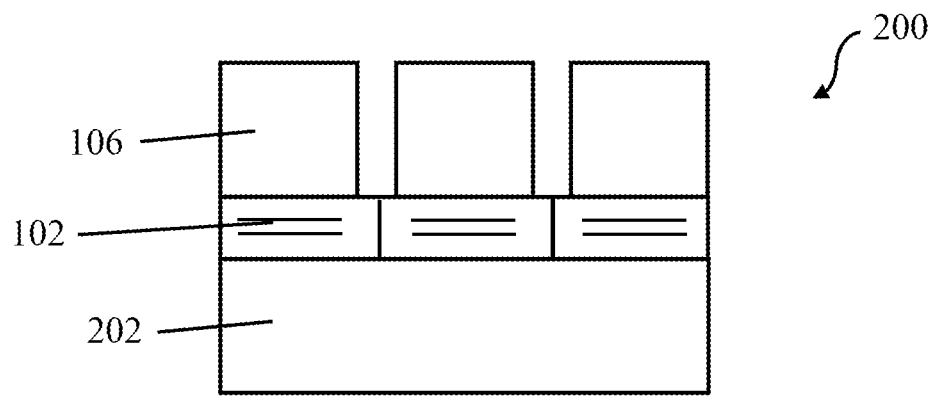
FIGS. 2A and 2B show, respectively, cross-sectional and top schematic views of an array of pcLEDs.
Figure 2B:
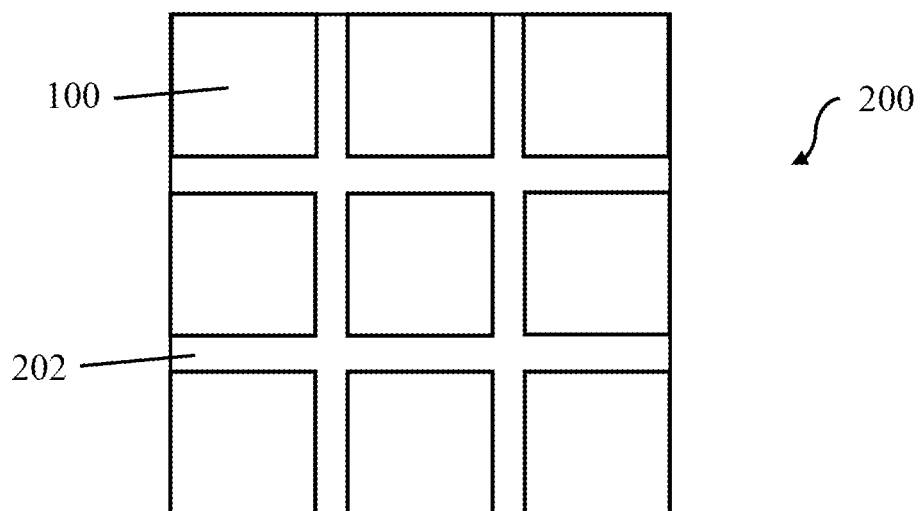

FIGS. 2A-2B show, respectively, cross-sectional and top views of an array 200 of pcLEDs 100 including phosphor pixels 106 disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Although FIGS. 2A-2B, show a three-by-three array of nine pcLEDs, such arrays may include for example tens, hundreds, or thousands of LEDs. Individual LEDs (pixels) may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by streets or lanes having a width in the plane of the array of, for example, hundreds of microns, less than or equal to 100 microns, less than or equal to 50 microns, less than or equal to 10 microns, or less than or equal to 5 microns. Although the illustrated examples show rectangular pixels arranged in a symmetric matrix, the pixels and the array may have any suitable shape.

LEDs having dimensions in the plane of the array (e.g., side lengths) of less than or equal to about 50 microns are typically referred to as microLEDs, and an array of such microLEDs may be referred to as a microLED array. An array of LEDs, or portions of such an array, may be formed as a segmented monolithic structure in which individual LED pixels are electrically isolated from each other by trenches and/or insulating material, but the electrically isolated segments remain physically connected to each other by portions of the semiconductor structure.

The individual LEDs in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. Such light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Figure 3A:
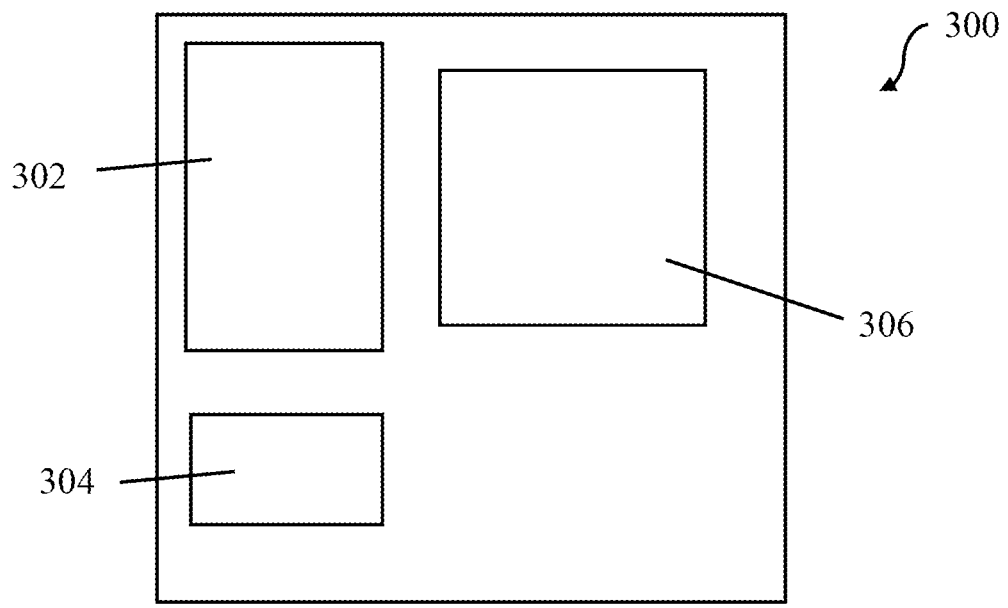
FIG. 3A shows a schematic top view of an electronics board on which an array of pcLEDs may be mounted, and FIG. 3B similarly shows an array of pcLEDs mounted on the electronic board of FIG. 3A.
Figure 3B:
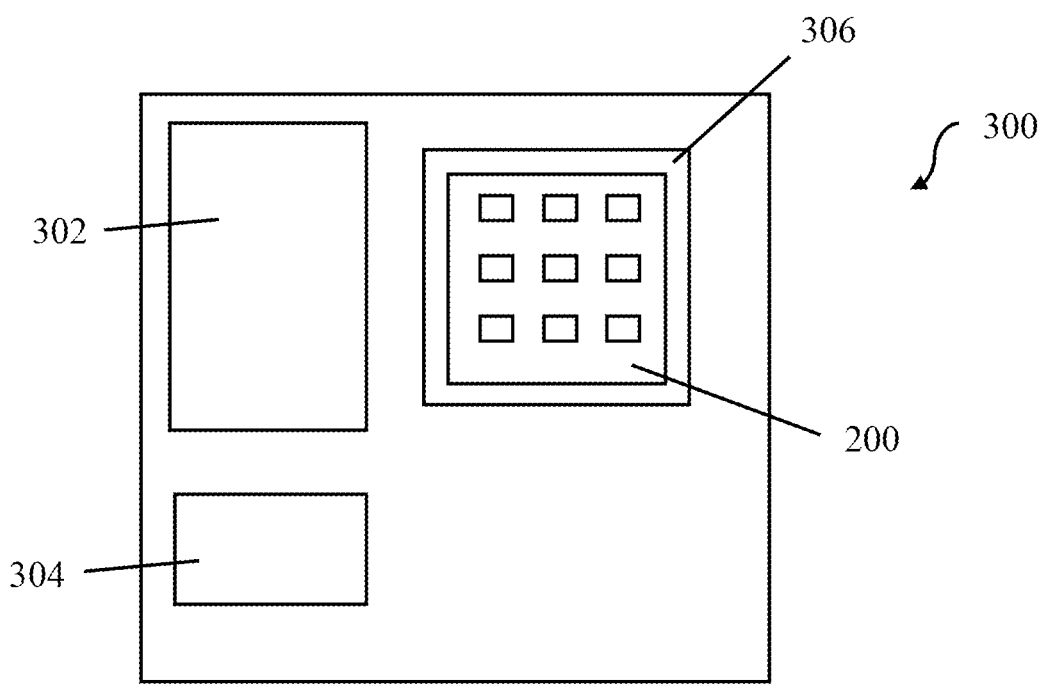

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
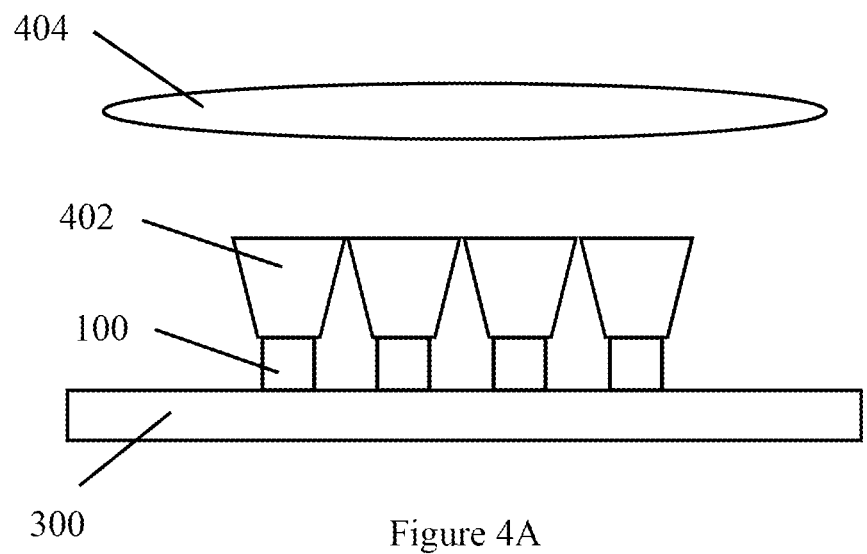
FIG. 4A shows a schematic cross sectional view of an array of pcLEDs arranged with respect to waveguides and a projection lens.
Figure 4B:
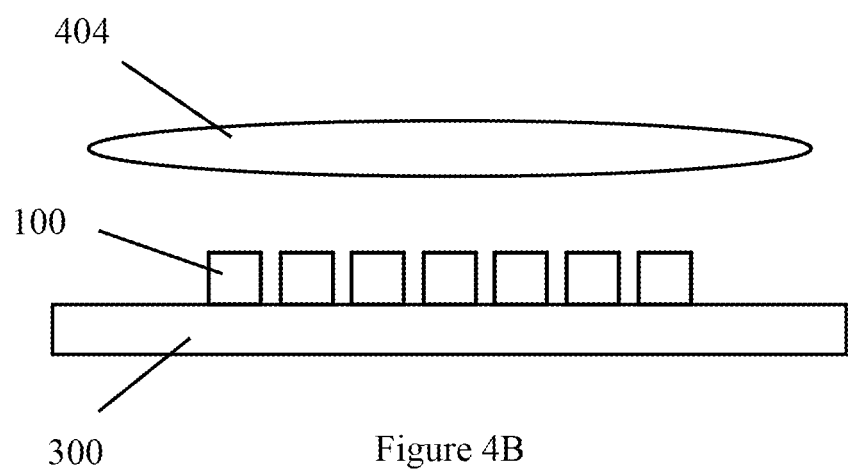
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive and illumination applications.

Figure 5A:
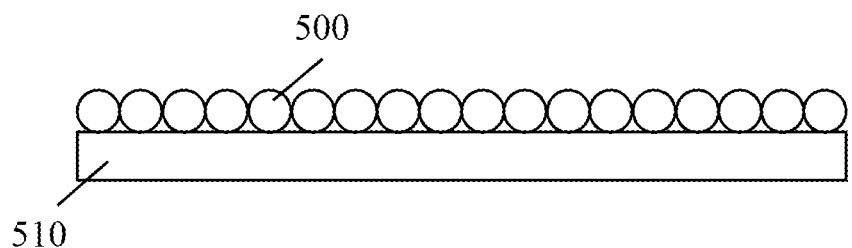
FIGS. 5A, 5B, 5C, and 5D schematically show cross-sectional views of stages during an example method of fabricating a pcLED comprising a thin compact wavelength converting structure as described herein.
Figure 5B:
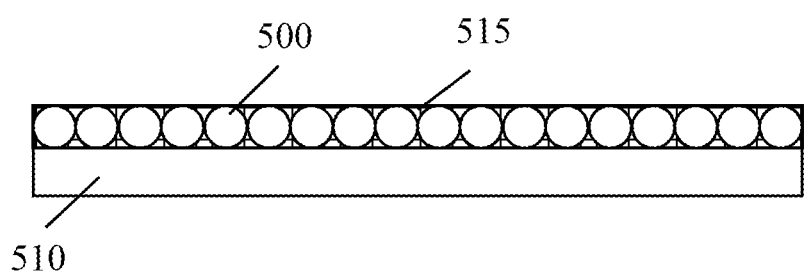
Figure 5C:
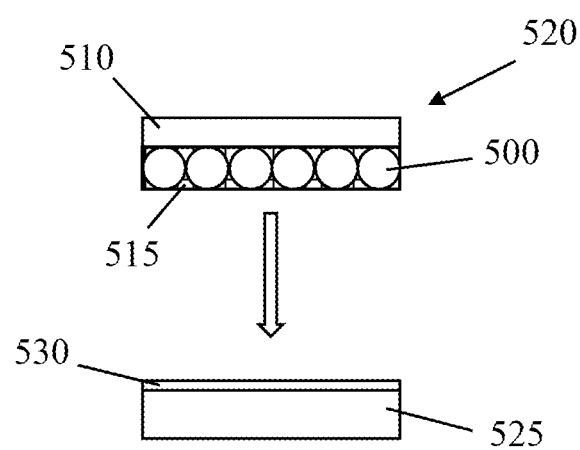
Figure 5D:
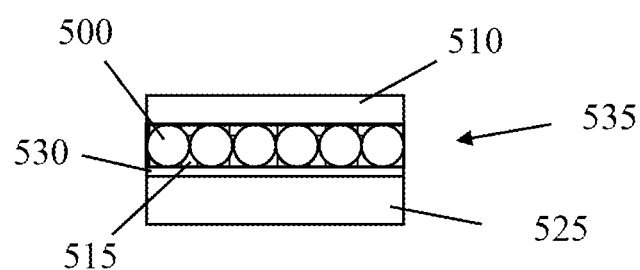

As summarized above, this specification discloses pcLEDs comprising thin and compact wavelength converting structures comprising one or more layers of phosphor particles that exhibit efficient optical coupling of the phosphor particle layers to the LED die light emitting surface in combination with superior heat conduction and thermal stability. FIG. 5D is a schematic cross-sectional view of one example of such a pcLED. FIGS. 5A-5C show schematic cross-sectional views of stages in an example method for fabricating the device of FIG. 5D.

Referring now to FIG. 5A, in a first step in preparing the wavelength converting structures disclosed herein phosphor particles 500 are disposed on a transparent substrate 510 at high packing density.

Any suitable phosphor particles may be used. The phosphor particles may all have the same composition. Alternatively, different phosphor particles may have different compositions and consequently different emission peak or centroid wavelengths. For example, phosphor particles of one, two, three, four, or five different compositions may be used having one, two, three, four, or five different corresponding emission peak or centroid wavelengths. Although FIGS. 5A-5D show only a single layer of phosphor particles, two or more layers of phosphor particles may be deposited stacked on each other. A layer of phosphor particles may comprise primarily or exclusively phosphor particles of the same composition. Alternatively, a layer of phosphor particles may comprise phosphor particles having different compositions.

In some variations, two or more layers of phosphor particles are deposited as a stack of phosphor layers with each layer having phosphor particles of a different composition. In such cases, it may be advantageous to deposit the layers of phosphor particles in order of peak or centroid emission wavelength, with the layer having the shortest peak or centroid emission wavelength deposited first and the layer having the longest peak or centroid emission wavelength deposited last.

In some other variations, only a single layer of phosphor particles is deposited, but the layer comprises a mixture of phosphor particles having two or more (e.g., two, three, four or five) different compositions and corresponding peak or centroid wavelengths.

The phosphor particles may have emission peaks in the visible and/or infrared wavelength ranges, for example. The phosphor particles may have median diameters of, for example, $1~\mu m \leq d50 \leq 30~\mu m$.

Any suitable transparent material may be used for the transparent substrate. For example, the transparent substrate may be a glass substrate. The transparent substrate may have any suitable thickness perpendicular to the phosphor layers. For example, the transparent substrate may have a thickness of 20 microns to 2 millimeters. Either or both sides of the substrate may be coated with an optical coating to change transmission and reflection properties of the substrate. Such coatings may comprise, for example, layers of alternating high/low refractive index material, or pigment particles (with median diameter 1<300 nm for example) that absorb but do not emit light.

The phosphor particles may be deposited as compact layers with high packing density by, for example, phosphor sedimentation, electrophoretic deposition, electrostatic dusting, spin coating, blade coating (with for example a polyvinyl alcohol/phosphor particle suspension), or printing (e.g. screen printing). Any suitable deposition method may be used.

The phosphor particles may be deposited without a binder material. Alternatively, the phosphor particles may be deposited with a binder material (e.g., an organic binder material) that is subsequently removed. The binder may be removed by, for example, heating the transparent substrate and the phosphor particle layers to evaporate, combust, or otherwise decompose and/or drive off the binder. Such a bake out process may occur at ≥250° C., for example. Such a bake out process may occur at about 450° C. for about 2 hours, for example. Similarly, any solvent used in depositing the binder particles may be subsequently removed by evaporation, for example with heating.

An advantage to using a transparent glass substrate is that after deposition of the phosphor particles the transparent substrate and the phosphor particle layers can be heated to more than 400° C. to thermally remove a binder without damaging the substrate.

Referring now to FIG. 5B, after the one or more phosphor particle layers are deposited and any binder removed, an inorganic non-absorbing coating 515 (e.g. $Al_2O_3$) is deposited on the phosphor particles. The inorganic coating layer may be deposited by, for example, atomic layer deposition (ALD), chemical vapor deposition (CVD), or a sol-gel process that infiltrates the phosphor layers. Any suitable inorganic material may be used for the coating, so long as the optical absorption of the coating material within the emission range of the LED and the phosphor materials is low. In addition to $Al_2O_3$, suitable materials may include for example other oxides, fluorides, phosphates, and silicates.

After the inorganic coating is applied, the transparent substrate, phosphor particle layers, and inorganic coating may be heated to remove any precursor residues remaining from the inorganic coating deposition process. Such a bake out process may occur at ≥250° C., for example. Such a bake out process may occur at about 450° C. for about 2 hours, for example.

Referring now to FIG. 5C, the transparent substrate with the coated phosphor particle layers is diced into two or more individual wavelength converters 520. A wavelength converter 520 may then be attached to an LED die 525 with a thin glue layer 530 that bonds a light emitting surface of the LED die to the phosphor particle layers in the wavelength converting structure. The glue may be a silicone (poly(organo)siloxane) or a silsesquioxane, for example. The glue layer may have a thickness of, for example, about 0.1 µm to about 5 µm. Upon attachment of the wavelength converting structure 520 to the die 525, the glue may penetrate pores in the inorganic-coated phosphor particle layers. The glue may thus contribute to the matrix material in the phosphor particle layers. In the resulting structure the pore volume in the phosphor particle layers of pores not penetrated by the glue may be ≤1% of the volume of the phosphor particle layers.

LED die 525 may comprise a semiconductor diode structure disposed on a transparent (e.g., patterned sapphire) substrate, in which case the wavelength converting structure 520 may be bonded to that transparent substrate. Alternatively, the LED die may be a thin film semiconductor diode structure lacking such a transparent substrate, in which case the wavelength converting structure may be bonded directly to an outer epitaxial layer of semiconductor diode structure.

The resulting example pcLED 535 is schematically shown in FIG. 5D. Reflective side coatings may be subsequently applied to the sides of pcLED 535.

This disclosure is illustrative and not limiting. Further modifications will be apparent to one skilled in the art in light of this disclosure and are intended to fall within the scope of the appended claims.

The invention claimed is:

1. A pcLED comprising:
a wavelength converting structure comprising:
a transparent substrate;
one or more layers of phosphor particles disposed on the transparent substrate at a packing density of greater than 50% and less than 90%; and
a coating of non-absorbing inorganic material on the phosphor particle layers that mechanically and thermally connects the phosphor particles to each other and to the transparent substrate;
an LED die comprising a light emitting surface, the LED die arranged with the light emitting surface adjacent the one or more layers of phosphor particles in the wavelength converting structure and with the light emitting surface on an opposite side of the one or more layers of phosphor particles from the transparent substrate; and
a transparent glue layer disposed on and wetting the light emitting surface of the LED die and mechanically and optically bonding the light emitting surface to the one or more layers of phosphor particles.

2. The pcLED of claim 1, wherein the transparent substrate is or comprises a transparent glass substrate.

3. The pcLED of claim 1, wherein the transparent substrate has a thickness of about 5 microns to about 2 millimeters.

4. The pcLED of claim 1, wherein the transparent substrate comprises one or more optical coatings.

5. The pcLED of claim 1, wherein the phosphor particles are disposed on the transparent substrate at a packing density of greater than 55%.

6. The pcLED of claim 1, wherein the phosphor particles are disposed on the transparent substrate at a packing density of greater than 60% and equal to or less than 74%.

7. The pcLED of claim 1, wherein the phosphor particles have a median diameter d50 of 1 µm≤d50≤30 µm.

8. The pcLED of claim 1, comprising a stack of two or more layers of phosphor particles, wherein:
each layer comprises phosphor particles of a different composition and a different peak or centroid emission wavelength from the other layers; and
the layers are stacked in order of peak or centroid emission wavelength, with the layer having the shortest peak or centroid emission wavelength closest to the transparent substrate and the layer having the longest peak or centroid emission wavelength farthest from the transparent substrate.

9. The pcLED of claim 1, wherein the non-absorbing inorganic material is or comprises $Al_2O_3$.

10. The pcLED of claim 1, wherein the transparent glue layer is or comprises a silicone.

11. The pcLED of claim 1, wherein the transparent glue layer penetrates pores in the one or more inorganic-coated layers of phosphor particles.

12. The pcLED of claim 11, wherein a pore volume of pores in the coated layers of phosphor particles not penetrated by the transparent glue layer is ≤1% of the volume of the one or more layers of coated phosphor particles.

13. The pcLED of claim 1, wherein:
the transparent substrate is or comprises a transparent glass substrate;
the phosphor particles have a median diameter d50 of 1 µm≤d50≤30 µm;
the non-absorbing inorganic material is or comprises $Al_2O_3$; and
the transparent glue layer is or comprises a silicone and penetrates pores in the one or coated layers of phosphor particles.

14. The pcLED of claim 13, wherein a pore volume of pores in the coated layers of phosphor particles not penetrated by the transparent glue layer is ≤1% of the volume of the one or more layers of coated phosphor particles.

* * * * *